(12) United States Patent
Liu et al.

(10) Patent No.: US 8,440,562 B2
(45) Date of Patent: May 14, 2013

(54) GERMANIUM-CONTAINING DIELECTRIC BARRIER FOR LOW-K PROCESS

(75) Inventors: Chung-Shi Liu, Shin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 234 days.

(21) Appl. No.: 12/881,939

(22) Filed: Sep. 14, 2010

(65) Prior Publication Data

US 2011/0003474 A1    Jan. 6, 2011

Related U.S. Application Data

(62) Division of application No. 11/731,941, filed on Apr. 2, 2007, now Pat. No. 7,816,789.

(51) Int. Cl.
*H01L 21/44* (2006.01)

(52) U.S. Cl.
USPC ............ 438/653; 438/654; 257/E21.584

(58) Field of Classification Search ............ 438/653, 438/654; 257/E21.584
See application file for complete search history.

(56) References Cited

U.S. PATENT DOCUMENTS

| | | | |
|---|---|---|---|
| 6,130,157 A | 10/2000 | Liu et al. | |
| 6,181,013 B1 | 1/2001 | Liu et al. | |
| 6,211,084 B1 | 4/2001 | Ngo et al. | |
| 6,330,929 B1 | 12/2001 | Gierc et al. | |
| 6,660,634 B1 | 12/2003 | Ngo et al. | |
| 6,821,890 B2 | 11/2004 | McGahay et al. | |
| 7,229,921 B2 * | 6/2007 | Hironaga et al. | 438/687 |
| 2001/0023987 A1 * | 9/2001 | Mcgahay et al. | 257/753 |
| 2007/0018329 A1 * | 1/2007 | Oh et al. | 257/762 |

OTHER PUBLICATIONS

Awaya, N., et al., "Self-Aligned Passivation Technology for Copper Interconnection Using Copper-Aluminum Alloy," Jpn. J. Appl. Phys., Mar. 1997, vol. 36, pp. 1548-1553, Part 1, No. 3B.
Gosset, L. G., et al., "Self-Aligned Barrier Approach: Overview on Process, Module Integration and Interconnect Performance Improvement Challenges," IITC, 2006, pp. 84-86, IEEE.
Ko, T. et al., "High Performance/Reliability Cu Interconnect with Selective CoWP Cap," 2003 Symposium on VLSI Technology Digest of Technical Papers, 2 pages.
Usami, T., et al., "Highly Reliable Interface of Self-aligned CuSiN process with Low-k SiC barrier dielectric (k=3.5) for 65nm node and beyond," IITC, 2006, pp.125-127, IEEE.

* cited by examiner

*Primary Examiner* — Thanh V Pham
*Assistant Examiner* — Duy T Nguyen
(74) *Attorney, Agent, or Firm* — Slater & Matsil, L.L.P.

(57) ABSTRACT

A semiconductor structure and methods of forming the same are provided. The semiconductor structure includes a semiconductor substrate; a first dielectric layer over the semiconductor substrate; a conductive wiring in the first dielectric layer; and a copper germanide nitride layer over the conductive wiring.

15 Claims, 5 Drawing Sheets

GERMANIUM-CONTAINING DIELECTRIC BARRIER FOR LOW-K PROCESS

CROSS REFERENCES

This application is a divisional of patent application Ser. No. 11/731,941, entitled "Geranium-containing Dielectric Barrier for Low-K Process," filed on Apr. 2, 2007, now issued as U.S. Pat. No. 7,816,789, which application is incorporated herein by reference.

TECHNICAL FIELD

This invention is related generally to integrated circuits, and more particularly to the structure and formation methods of interconnect structures in integrated circuits, and even more particularly to the formation of barrier layers on copper features.

BACKGROUND

A commonly used method for forming metal lines and vias is known as "damascene." Generally, this method involves forming an opening in a dielectric layer, which separates the vertically spaced metallization layers. The opening is typically formed using conventional lithographic and etching techniques. After the formation, the opening is filled with copper or copper alloys to form a via or a trench. Excess metal material on the surface of the dielectric layer is then removed by chemical mechanical polish (CMP). The remaining copper or copper alloy forms vias and/or metal lines.

Copper is typically used in the damascene process because of its lower resistivity. However, copper suffers from electro-migration (EM) and stress-migration (SM) reliability issues, particularly as geometries continue to shrink and current densities continue to increase. Therefore, barrier layers are typically formed to prevent copper from diffusing into neighboring low-k dielectric materials. Recently, copper silicide nitride layers are increasingly used as barrier layers.

FIG. 1 illustrates a cross-sectional view of an intermediate stage in the formation of a conventional interconnect structure. Copper line 4 is formed in a low-k dielectric layer 2. Copper silicide layer 6, which acts as a barrier layer, is formed on the top surface of copper line 4 by exposing copper line 4 to silane plasma. Subsequently, copper silicide layer 6 is nitridated to form a copper silicide nitride layer by treating the structure shown in FIG. 1 in nitrogen-containing plasma (such as $NH_3$ plasma).

The conventional formation process of barrier layers suffers drawbacks. Since copper silicide is relatively unstable, silicon may still break from copper silicide and diffuse into low-k dielectric layer 2. Therefore, it is preferred that copper silicide layer 6 is fully nitridated to form copper silicide nitride, which is more stable. This requires long $NH_3$ plasma treatment and/or high power. However, plasma treatments have the side effect of incurring damage to low-k dielectric layer 2. FIG. 2 schematically illustrates damaged low-k dielectric layers 8, which are damaged portions of low-k dielectric layer 2 adjacent copper line 4. Typically, due to plasma treatment, carbon is depleted from low-k dielectric layers 8, and thus the k value of dielectric layers 8 increases. To reduce the damage to low-k dielectric layer 2, shorter plasma treatment and/or lower power are preferred.

The conflicting requirements to the plasma treatment time and power leave a small process window for nitrogen-containing plasma treatment. It is difficult to control the formation of copper silicide nitride layer without incurring the side effects. Therefore, what is needed in the art is an interconnect structure and formation methods that may incorporate barrier layers thereof to take advantage of the benefits associated with the reduced copper diffusion while at the same time overcoming the deficiencies of the prior art.

SUMMARY OF THE INVENTION

In accordance with one aspect of the present invention, a semiconductor structure includes a semiconductor substrate; a first dielectric layer over the semiconductor substrate; a conductive wiring in the first dielectric layer; and a copper germanide nitride layer over the conductive wiring.

In accordance with another aspect of the present invention, a semiconductor structure includes a substrate; a low-k dielectric layer over the substrate; an opening extending from a top surface of the low-k dielectric layer into the low-k dielectric layer; a barrier layer lining the opening; a copper-containing conductive line in a remaining portion of the opening; and a copper germanide nitride layer over the copper-containing conductive line.

In accordance with yet another aspect of the present invention, a method for forming a semiconductor structure includes providing a semiconductor substrate; forming a first dielectric layer over the semiconductor substrate; forming a conductive wiring in the first dielectric layer; and forming a copper germanide nitride layer over the conductive wiring.

In accordance with yet another aspect of the present invention, a method for forming a semiconductor structure includes providing a semiconductor substrate; forming a first dielectric layer over the semiconductor substrate; forming an opening extending from a top surface of the first dielectric layer into the first dielectric layer; forming a copper-containing conductive line in the first dielectric layer; forming a copper germanide layer on the copper-containing conductive line; and nitridating at least a top portion of the copper germanide layer to form a copper germanide nitride layer.

The advantageous features of the present invention include more stable dielectric layers, hence reduced copper diffusion, reduced damaged to low-k dielectric layers, and reduced resistivity of un-nitrided silicide layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Interconnect structures comprising copper germanide nitride barrier layers and methods of forming the same are provided. The intermediate stages of manufacturing preferred embodiments of the present invention are illustrated in FIGS. 3 through 7. Throughout the various views and illustrative embodiments of the present invention, like reference numbers are used to designate like elements.

Figure 1:
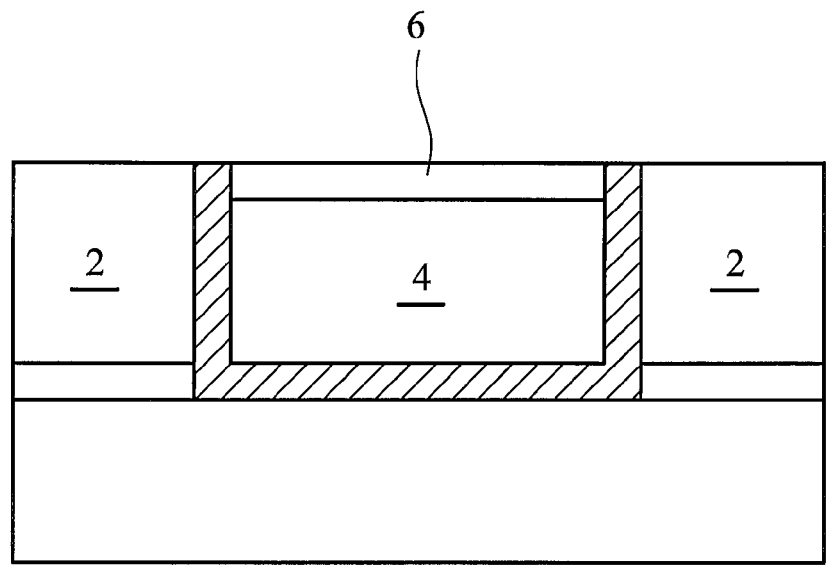
FIG. 1 illustrates a conventional interconnect structure in a low-k dielectric layer, wherein a copper silicide nitride is formed on copper.
Figure 2:
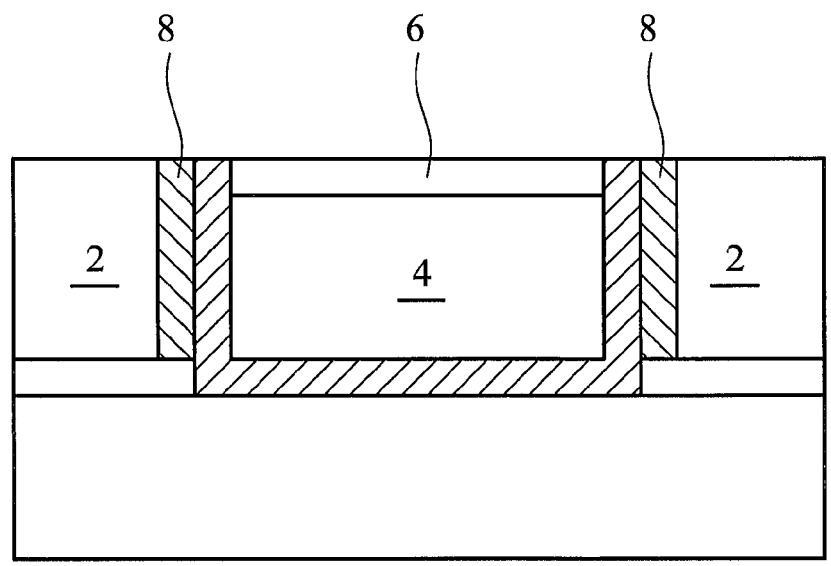
FIG. 2 illustrates an interconnect structure with a damaged low-k dielectric layer due to plasma treatment.
Figure 3:
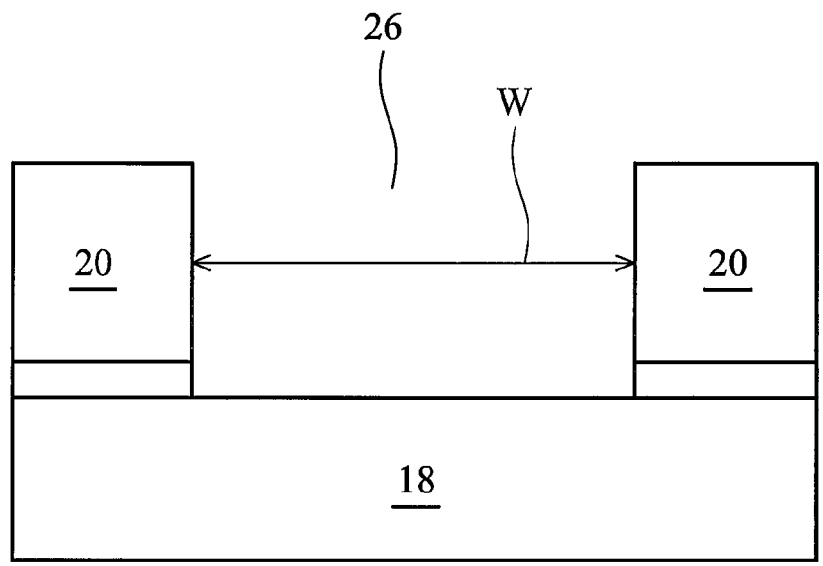
FIGS. 3 through 7 are cross-sectional views of intermediate stages in the manufacturing of an embodiment of the present invention.

FIG. 3 illustrates the formation of opening 26 in dielectric layer 20, which is formed over a schematically illustrated base layer 18. Base layer 18 may include a semiconductor substrate and overlying layers such as contact etch stop layer, inter-layer dielectric, and inter-metal dielectrics (not shown). The semiconductor substrate may be a single crystalline or a compound semiconductor substrate. Active devices (not shown) such as transistors, may be formed on the semiconductor substrate. Opening 26 may be a trench for forming a metal line. Width W of opening 26 is preferably less than about 50 nm. In an exemplary embodiment, dielectric layer 20 has a low dielectric constant (k value), preferably lower than about 3.0, hence is referred to as low-k dielectric layer 20 throughout the description. More preferably, low-k dielectric layer 20 has a k value of less than about 2.5, and hence is sometimes referred to as an extreme low-k (ELK) dielectric layer. Low-k dielectric layer 20 may include commonly used materials such as carbon-containing dielectric materials, and may further contain nitrogen, hydrogen, oxygen, and combinations thereof. A porous structure may be used for lowering the k value. The preferred thickness of low-k dielectric layer 20 is between about 1000 Å and about 3500 Å. One skilled in the art will realize, however, that the dimensions recited throughout the description are related to the technology used for forming the integrated circuits, and will reduce accordingly with the scaling of the technology.

Figure 4:
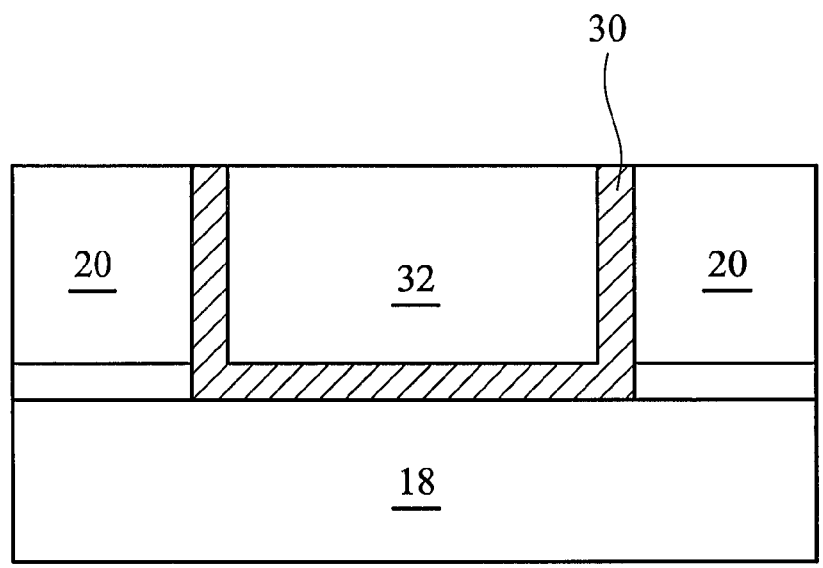

FIG. 4 illustrates the formation of (diffusion) barrier layer 30 lining opening 26, and conductive line 32 in opening 26. Barrier layer 30 preferably includes titanium, titanium nitride, tantalum, tantalum nitride, or other alternatives, and may be formed using physical vapor deposition (PVD) or one of the chemical vapor deposition (CVD) methods. The thickness of barrier layer 30 may be between about 20 Å and about 200 Å.

Conductive line 32 preferably comprises copper or copper alloys. Throughout the description, conductive line 32 is alternatively referred to as copper line 32, although it may include other conductive materials, such as silver, gold, tungsten, aluminum, and the like. As is known in the art, the steps for forming diffusion barrier layer 30 and copper line 32 may include blanket forming barrier layer 30, depositing a thin seed layer of copper or copper alloy on barrier layer 30, and filling opening 26 with a conductive material, such as copper, preferably by plating. A chemical mechanical polish (CMP) is then performed to remove excess conductive material on low-k dielectric layer 20, leaving diffusion barrier layer 30 and copper line 32 only in opening 26.

A pretreatment is then performed to treat the surface of copper line 32. In the preferred embodiment, the pretreatment includes a hydrogen-based gas treatment in a production tool, such as one used for plasma enhanced chemical vapor deposition (PECVD). The hydrogen-based gases preferably include $N_2$, $NH_3$, and the like. In alternative embodiments, the pretreatment is performed in a hydrogen-based gas environment, which contains hydrogen-containing gases, such as $H_2$, $NH_3$, and the like. The pretreatment has the function of reducing native copper oxide to copper and removing chemical contamination from copper line 32.

Figure 5:
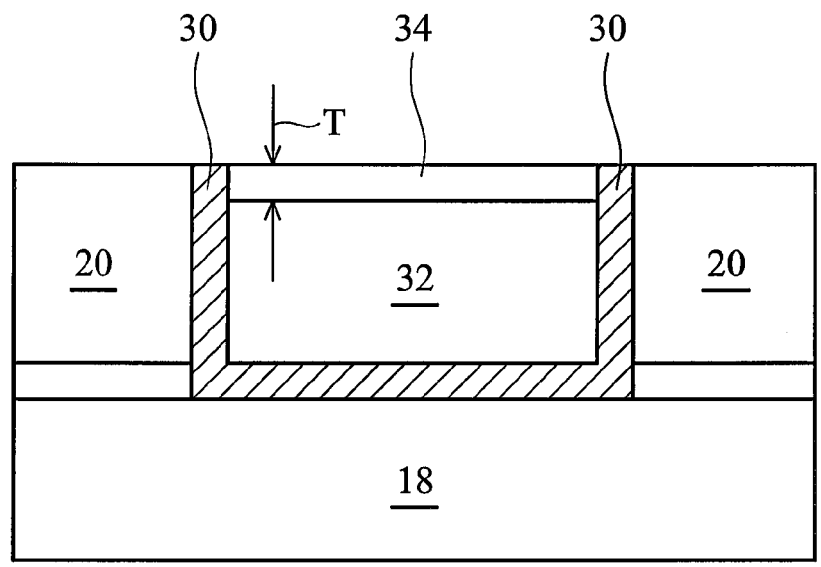

FIG. 5 illustrates the formation of copper germanide ($CuGe_x$) layer 34. In one embodiment, the structure shown in FIG. 4 is thermal soaked in a germanium-containing gas, such as $GeH_4$, $GeH_6$, and combinations thereof, wherein the thermal soaking occurs in an environment (ambient) at an elevated temperature, for example, higher than about 150° C. Throughout the description, when the term "thermal soaking" is referred to, it indicates that plasma is not turned on or the soaking is substantially free from plasma, unless specifically noted. In an exemplary embodiment, the temperature of the ambient is between about 150° C. and about 450° C., and the pressure of the soaking gas is between about 0.1 mtorr and about 100 torr. In the thermal environment, the germanium-containing soaking gas reacts with copper to form copper germanide layer 34 on copper line 32. One skilled in the art will perceive that thickness T of copper germanide layer 34 is related to the temperature, soaking pressure, concentration of GeH4 and soaking duration. In an exemplary embodiment, the soaking duration is between about 5 seconds and about 2 minutes. Accordingly, thickness T is between about 20 Å and about 300 Å.

It is noted that although copper germanide layer 34 is preferably formed by thermal soaking copper in a germanium-containing gas, other commonly used methods, such as chemical vapor deposition (CVD), atomic layer CVD, and the like, may also be used to deposit copper germanide layer 34. Accordingly, conductive line 32 may be formed of metals other than copper.

Figure 6A:
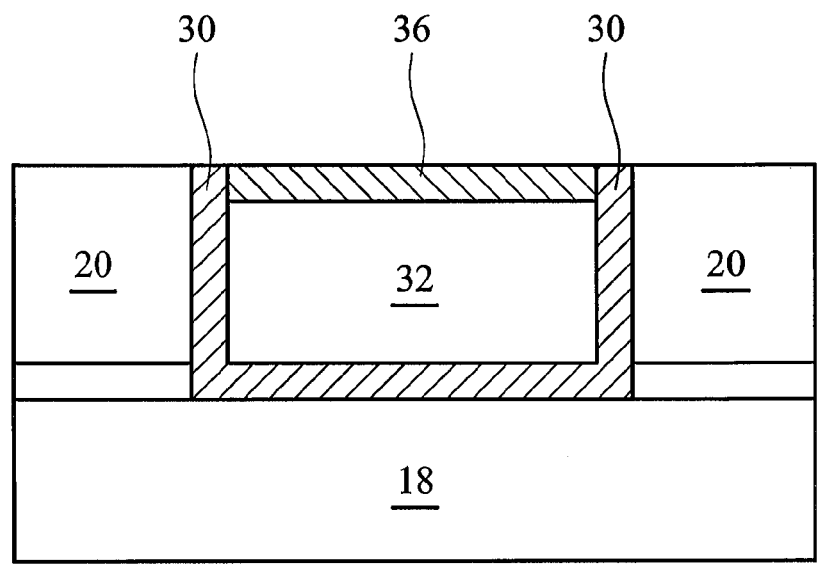

Referring to FIG. 6A, copper germanide layer 34 is nitridated to form copper germanide nitride layer 36. In the preferred embodiment, the nitridation includes a plasma treatment of copper germanide layer 34 in a nitrogen-containing environment. In an exemplary embodiment, process gases include $NH_3$ with a pressure of between about 1 mtorr and about 100 torr, and the treatment temperature is between about 200° C. and about 450° C. In other embodiments, the process gases include a combined gas of $H_2$ and $N_2$. The process gases may also include other commonly used treatment gases and carrier gases such as He, Ar, and the like. Preferably, copper germanide nitride layer 36 has a thickness of between about 20 Å and about 200 Å.

Figure 6B:
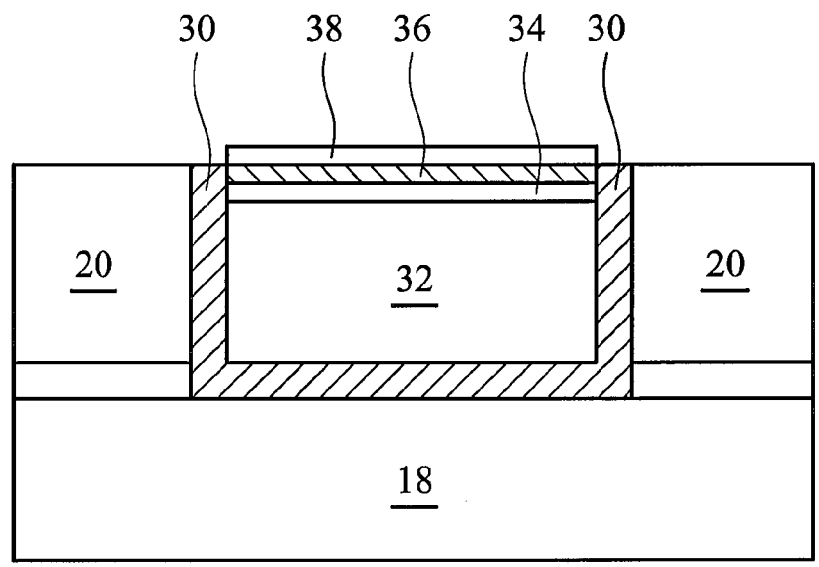

FIG. 6A illustrates an embodiment, wherein copper germanide layer 34 is fully nitridated as copper germanide nitride ($CuGe_xN_y$) layer 36. In other embodiments, the duration and/or power of the plasma treatment are reduced, so that only a top portion of copper germanide layer 34 is converted to copper germanide nitride layer 36, while a lower portion of copper germanide layer 34 remains, as shown in FIG. 6B. Please note that the composition of the resulting layers formed on copper line 32 may be different depending on the treatment conditions. In a first example, germanium nitride layer 38 is formed on copper germanide nitride layer 36 if adequate nitrogen is supplied. In another exemplary embodiment, germanium nitride layer 38 may be formed on copper germanide nitride layer 36, which further resides on the remaining portion of copper germanide layer 34.

Figure 7:
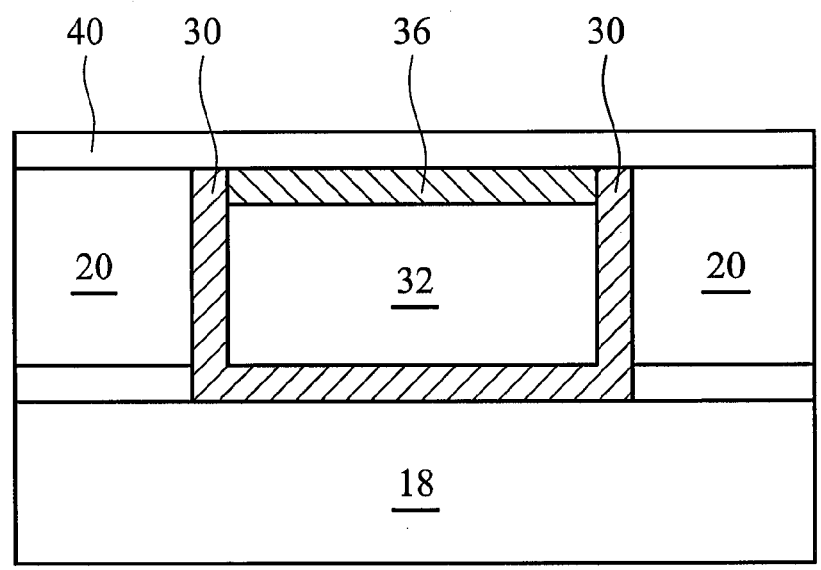

FIG. 7 illustrates the formation of etch stop layer (ESL) 40. ESL 40 preferably has a dielectric constant of less than about 4.0, and may comprise materials such as silicon carbide (SiC), carbon-doped silicon nitride (SiCN), carbon-doped silicon oxide (SiCO), silicon nitride (SiN), carbon-based materials, as well as germanium carbide (GeC), carbon-doped germanium nitride (GeCN), carbon-doped germanium oxide (GeCO), germanium nitride (GeN), and combinations thereof. The preferred thickness of ESL 40 is between about 200 Å and about 1000 Å. ESL 40 can also be in situ formed after the formation of copper germanide nitride, for example, if GeH$_4$ and NH$_3$ gases co-exist in a plasma environment, germanium nitride will be formed as a blanket ESL layer fully covering the corresponding wafer.

Figure 8:
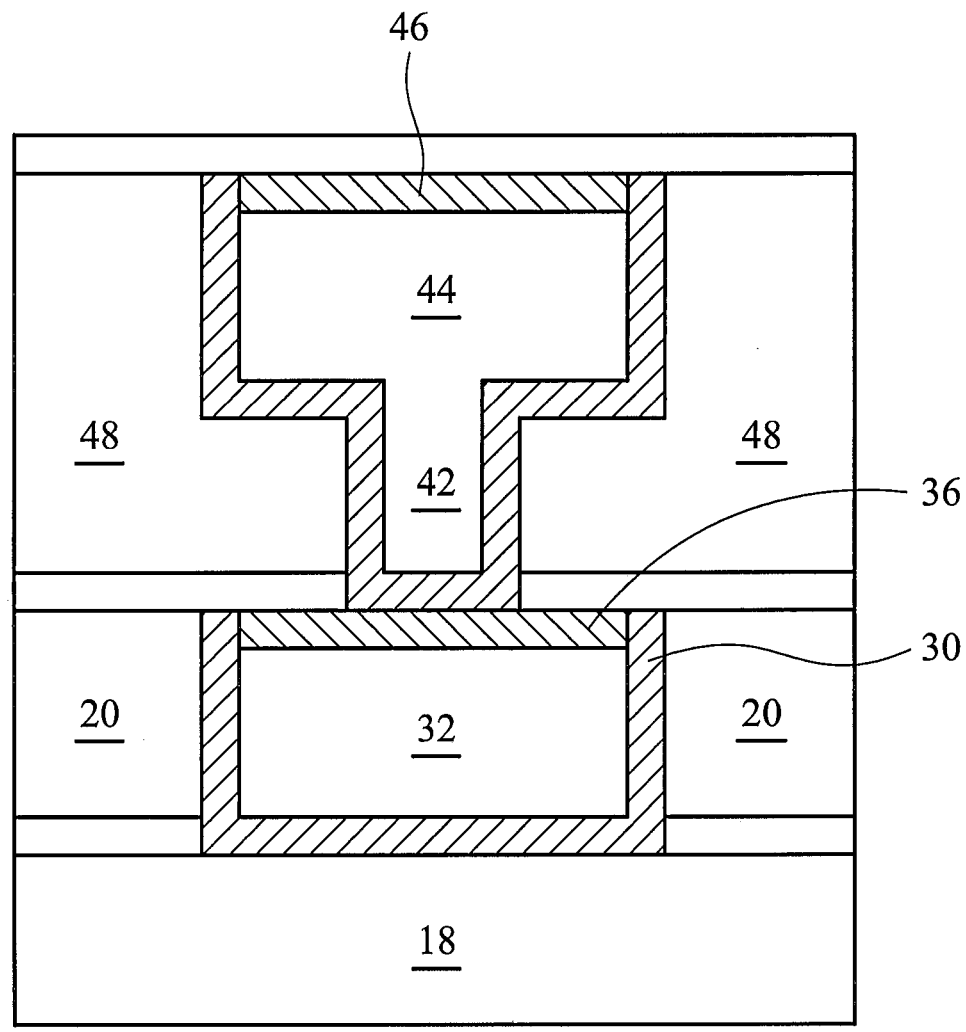
FIG. 8 illustrates an embodiment of the present invention, wherein a copper germanide nitride barrier layer is formed on a dual damascene structure.

In the preceding paragraphs, single damascene processes are discussed. One skilled in the art will realize that the teaching is readily available for dual damascene processes. FIG. 8 illustrates a dual damascene embodiment, which includes via 42 and the overlying copper line 44 in a low-k dielectric layer 48. Using essentially the same process steps as discussed in preceding paragraphs, copper germanide nitride layer 46 may be formed. Similarly, the dual damascene structure may further include a copper germanide layer (not shown) underlying copper germanide nitride layer 46, or a germanium nitride layer (not shown) overlying copper germanide nitride layer 46.

An advantageous feature of the embodiments of the present invention is that copper germanide is relatively stable, and thus copper in copper germanide is unlikely to diffuse. Therefore, It is unnecessary to fully convert copper germanide to copper germanide nitride. The treatment time and/or power for nitridating copper germanide may thus be reduced. Accordingly, the damage incurred to low-k dielectric layers is reduced. An additional advantageous feature of the present invention is that copper germanide has a low resistivity (about 6 ohm-cm). Therefore, the adverse effect of the un-nitrided copper germanide layer to the resistance of the interconnect structure is low. As a comparison, copper silicide may have a resistivity of about 50 ohm-cm, and hence has a higher adverse effect on the resistance of the interconnect structure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method comprising:
   forming a dielectric layer over a semiconductor substrate;
   forming a conductive wiring in the dielectric layer;
   forming a copper germanide layer over the conductive wiring;
   nitridating at least a top portion of the copper geimanide layer to form a copper germanide nitride layer; and
   forming an etch stop layer over and in physical contact with the copper germanide nitride layer.

2. The method of claim 1, wherein during the step of nitridating, a bottom portion of the copper germanide layer is not nitridated.

3. The method of claim 1, wherein during the step of nitridating, an entirety of the copper germanide layer is nitridated.

4. The method of claim 1, wherein the step of nitridating comprises plasma treating the copper germanide layer in a nitrogen-containing gas.

5. The method of claim 4, wherein the nitrogen-containing gas is selected from the group consisting essentially of NH$_3$, N$_2$, H$_2$, and combinations thereof.

6. The method of claim 1, wherein the conductive wiring comprises copper, and wherein the step of forming the copper germanide layer comprises thermal soaking the conductive wiring in a germanium-containing gas.

7. The method of claim 6, wherein the step of thermal soaking is performed without plasma.

8. The method of claim 1, wherein the step of nitridating comprises treating the copper germanide layer in a nitrogen-containing environment to convert the at least the top portion of the copper germanide layer into the copper germanide nitride layer.

9. The method of claim 1, wherein the step of forming the etch stop layer is performed after the step of nitridating the at least the top portion of the copper germanide layer.

10. The method of claim 9, wherein the etch stop layer comprises a first portion having a first bottom surface and a second portion having a second bottom surface, wherein the first bottom surface is in physical contact with a top surface of the copper germanide nitride layer, and the second bottom surface is in physical contact with a top surface of the dielectric layer, and wherein the first and the second surfaces are surfaces of a same material.

11. A method for forming a semiconductor structure, the method comprising:
   forming a dielectric layer over a semiconductor substrate;
   forming an opening extending from a top surface of the dielectric layer into the dielectric layer;
   forming a copper-containing conductive line in the dielectric layer;
   forming a copper germanide layer over the copper-containing conductive line;
   nitridating a top portion of the copper germanide layer by treating the copper germanide layer in a nitrogen-containing environment to convert the top portion of the copper germanide layer into a copper germanide nitride layer, wherein a bottom portion of the copper germanide layer is not nitridated; and
   after the step of nitridating, forming a dielectric etch stop layer (ESL) over and in physical contact with the copper germanide nitride layer.

12. The method of claim 11, wherein the step of forming the copper germanide layer is performed by thermal soaking the copper-containing conductive line in a germanium-containing environment.

13. The method of claim 11, wherein the step of nitridating the top portion of the copper germanide layer comprises plasma treating the copper germanide layer in a nitrogen-containing gas.

14. The method of claim 13, wherein the nitrogen-containing gas is selected from the group consisting essentially of NH$_3$, N$_2$, H$_2$, and combinations thereof.

15. The method of claim 11, wherein the dielectric etch stop layer comprises a first portion having a first bottom surface and a second portion having a second bottom surface, wherein the first bottom surface is in physical contact with a top surface of the copper germanide nitride layer, and the second bottom surface is in physical contact with a top surface of the dielectric layer, and wherein the first and the second surfaces are surfaces of a same material.

* * * * *

UNITED STATES PATENT AND TRADEMARK OFFICE
CERTIFICATE OF CORRECTION

| | |
|---|---|
| PATENT NO. | : 8,440,562 B2 |
| APPLICATION NO. | : 12/881939 |
| DATED | : May 14, 2013 |
| INVENTOR(S) | : Liu et al. |

Page 1 of 1

It is certified that error appears in the above-identified patent and that said Letters Patent is hereby corrected as shown below:

In the Claims

In Col. 5, line 57, claim 1, delete "geimanide" and insert --germanide--.

Signed and Sealed this
Sixteenth Day of July, 2013

Teresa Stanek Rea
*Acting Director of the United States Patent and Trademark Office*